United States Patent [19]

Zampini

[11] Patent Number: 5,130,410

[45] Date of Patent: Jul. 14, 1992

[54] ALTERNATING AND BLOCK COPOLYMER RESINS

[75] Inventor: Anthony Zampini, Westborough, Mass.

[73] Assignee: Shipley Company Inc., Newton, Mass.

[21] Appl. No.: 661,121

[22] Filed: Feb. 27, 1991

Related U.S. Application Data

[63] Continuation-in-part of Ser. No. 411,670, Sep. 25, 1989, abandoned, which is a continuation of Ser. No. 108,192, Oct. 13, 1987, abandoned, which is a continuation-in-part of Ser. No. 2,364, Dec. 23, 1986, abandoned.

[51] Int. Cl.$^5$ .............................................. C08G 65/38
[52] U.S. Cl. .................... 528/218; 528/212; 528/219; 525/480; 525/491; 525/501
[58] Field of Search .................. 525/480, 491, 503; 528/218, 212, 86, 88, 89; 430/192, 193

[56] References Cited

U.S. PATENT DOCUMENTS

| | | | |
|---|---|---|---|
| 2,437,710 | 3/1948 | Rhodes | 525/480 |
| 4,013,605 | 3/1977 | Hultzsch et al. | 260/29.3 |
| 4,377,631 | 3/1983 | Toukhy et al. | 430/192 |
| 4,529,682 | 7/1985 | Toukhy | 430/190 |
| 4,587,196 | 5/1986 | Toukhy | 430/192 |
| 4,614,826 | 9/1986 | Katayama et al. | 549/559 |
| 4,690,882 | 9/1987 | Tanigaki et al. | 430/192 |
| 4,837,121 | 6/1989 | Blakeney et al. | 430/192 |

FOREIGN PATENT DOCUMENTS 0118291 9/1984 European Pat. Off. .
0273026 6/1988 European Pat. Off. .

OTHER PUBLICATIONS

Hiemejz, P.C., *Polymer Chemistry*, M. Dekker, Inc., N.Y., 1984, p. 38, QD 381. H5 1984. Copy in Biotech Lib.

*Primary Examiner*—John Kight, III
*Assistant Examiner*—Richard Lee Jones
*Attorney, Agent, or Firm*—Robert L. Goldberg

[57] ABSTRACT

This invention relates to alternating and block copolymer resins and methods for preparing the same. The alternating copolymer resins are formed from the reaction of a preformed bishydroxymethyl phenol and a reactive phenolic compound. The alternating copolymer may then be further reacted with a second reactive compound in the presence of an aldehyde to form the substantially block copolymer. The alternating and block copolymer resins are characterized by enhanced ortho-, ortho-coupling and low molecular weight distribution.

11 Claims, No Drawings

ALTERNATING AND BLOCK COPOLYMER RESINS

CROSS REFERENCE TO RELATED APPLICATIONS

This application is a continuation-in-part of copending U.S. patent application Ser. No. 07/411,670 filed Sep. 25, 1989 now abandoned which application is in turn a continuation of U.S. patent application Ser. No. 07/108,192 filed Oct. 13, 1987 (now abandoned) which latter application is a continuation-in-part of U.S. patent application Ser. No. 002,364 filed Dec. 23, 1986 (now abandoned).

BACKGROUND OF THE INVENTION

1. Introduction

This invention relates to novel novolak resins and a novel process for making the same. The novel novolak resins are formed from bishydroxymethylated phenols reacted with other reactive phenolics to produce an alternating copolymer. Further reaction of the alternating copolymer, with different reactive phenols or mixtures of reactive phenols, in the presence of an aldehyde leads to the formation of a block copolymer. The copolymer resins may be used alone or in blends with the same or other novolak resins.

2. Discussion of Related Art

The formation of novolak resins by condensation of a phenol with an aldehyde is well known in the art. Toukhy et al in U.S. Pat. Nos. 4,377,631 and 4,587,196 disclose novolak resins produced by condensing with formaldehyde a mixture of m-cresol and p-cresol or o-, m- and p-cresol, with the various cresol isomers present by weight in selected proportions. The average molecular weight of the resins formed is a function of the number of cresol units that become linked by methylene bridges as a result of the reaction with formaldehyde to form the resin molecules. The resin molecules formed are random in nature. The patent teaches that a higher molecular weight novolak may be obtained by increasing the ratio of formaldehyde to cresol thereby increasing the degree of linkage of the cresol units. The patent teaches that the maximum molar ratio of formaldehyde to cresols is 0.9:1. Higher molar ratios of formaldehyde with cresols leads to crosslinking and resin intractability, thereby limiting the extent to which the molecular weight can be controlled.

EPO Application No. 0 118 291, U.S. Pat. No. 4,830,413 discloses novolak resins obtained by the addition condensation of a phenol and formaldehyde wherein the phenol is one in which the average carbon number in any substituent per phenol nucleus is 0.5 to 1.5 and less than 50 mol % of the molecules have substituents at the ortho- or para-position with respect to the hydroxyl group. If these specific conditions for selection of the phenol are not met, the resulting novolak will have slow dissolution rates and will not have the expected improvement in optical properties.

U.S. Pat. No. 4,614,826 describes polynuclear polyhydric phenols prepared by reacting a dihydric phenol with a specific substituted phenol in the presence of an acid catalyst. The dihydric phenols used are catechol, resorcinol and hydroquinone. The substituted phenols used in the reaction are typically the bishydroxyalkyl phenols. The dihydric phenol is ordinarily used in an amount of 1 to 8 moles per mole of the substituted phenol. The resulting polynuclear polyhydric phenols, which contain up to 10 polymer units, are low molecular weight resins The resins are used to form polyepoxy compounds useful in resins.

U.S. Pat. No. 4,837,121 describes phenolic resins made by reacting a halogen-substituted resorcinol with a para-lower alkyl-substituted 2,6-bis(hydroxymethyl)-phenol compound in the presence of an acid catalyst. The mole ratio of the resorcinol compound to the bishydroxymethylphenol used in the condensation reaction ranges from 0.5:1 to 1.7:1. Because of the position of the substituent on the phenolic rings, the condensation polymerization results in ortho-, ortho-bonding between each phenolic structure. The patent further describes the addition of third phenolic compound (m- or p- alkoxy substituted phenol) which will condense with the bishydroxymethyl phenol. However, with the third phenolic compound, only the para-alkoxy substituted phenol gives ortho-, ortho- bonding, while the meta-alkoxy substituted phenol gives a mixture of ortho-, ortho-bonding and ortho-, para- bonding. The resulting resins have molecular weights form about 500 to 10,000. When resins containing the third phenolic compound are desired, they usually comprise about 20 to 60 percent of the phenol feed.

SUMMARY OF THE INVENTION

The subject invention is directed to novel alkali soluble novolak resins comprising the condensation product of a preformed bishydroxymethyl phenol with a reactive phenol, in the absence of an aldehyde, to form an alternating copolymer. The alternating copolymer is then further reacted with the same reactive phenol, a second reactive phenol or mixture of phenols in the presence of an aldehyde to form the block copolymer.

In a typical mixed cresol-formaldehyde condensation reaction to form novolaks, the m-cresol isomer is more reactive and tends to dominate the formed polymer, and the resulting copolymer is a random one. In the method of the present invention, the novel novolak resins are characterized by regular alternating copolymer structures since they are formed in the absence of an aldehyde.

The acid catalyzed condensation of formaldehyde with m-cresol, 3,5-dimethylphenol or other similar substituted phenols is known to result in resin structures having primarily ortho-, para- coupling. It has been unexpectedly found that the process of the present invention results in structures having substantial ortho-, ortho- coupling when the above reactive phenols are used.

The alternating copolymers formed by the above process may be further reacted with a reactive phenol, in the presence of an aldehyde, to form a substantially block copolymer. Since the alternating copolymers have been formed by the reaction of preformed bishydroxymethyl phenols and a reactive phenol, in the absence of formaldehyde, the minimal amount of one of the reactive phenols present in the resulting block copolymer is known.

The process of the invention forms both alternating and block copolymers that have preferred dissolution behavior in dilute aqueous base and are characterized by a narrow and controlled molecular weight distribution, whereby the weight average molecular weight to number average molecular weight ratio is in the range of 3 to 4 or lower.

DESCRIPTION OF THE PREFERRED EMBODIMENTS

The alternating novolak resins of the present invention are condensation products of bishydroxymethyl phenols with reactive phenols. The bishydroxymethylated phenolic compounds that are particularly useful in this invention are represented by the following structure:

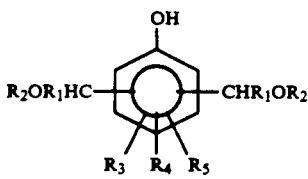

where:

$R_1$ is hydrogen, an alkyl, an aryl, or a hetero-cyclic group, but preferably is H;

$R_2$ is hydrogen, an alkyl or an acyl group, but preferably is hydrogen or methyl;

$R_3$ and $R_5$ are hydrogen, halogen, an alkyl group free of a tertiary alpha-carbon atom, an alkoxy group having 1 to 4 carbon atoms, a phenoxy group, an aryl group or an arylalkyl group; and $R_4$ is the same as $R_3$ and $R_5$, and in addition is a carboxylic group.

The preformed bishydroxy-methyl phenols may be formed by the reaction of formaldehyde with o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid, p-nitro phenol and the like, in the presence of a base. Suitable bases which will promote the reaction include sodium or potassium hydroxide.

The bishydroxymethyl groups of the above preformed phenolics are reactive and may in the presence of heat, acid or base react with other bishydroxymethyl groups present in the reaction, or with another reactive compound. If the reactive compound is another phenolic material, such as phenols, cresols, dimethylphenols, trimethylphenols, naphthols, biphenols, phenylphenols, bis(hydroxyphenyl)methane, isopropylidenebiphenols, catechols, resorcinols, thiobiphenols and the like, which contains at least two sites in the aromatic ring(s) of sufficient reactivity to undergo facile Friedel-Crafts reactions, then the condensation reaction of the reactive compound with the preformed bishydroxymethylated phenolic compound will sustain polymerization and result in the formation of the alternating copolymers of the present invention. The key to the formation of these alternating copolymers, instead of random copolymers, is the absence of any aldehyde during the reaction.

To prepare polymers having utility in photoresists compositions, the bishydroxymethylated phenolic compound and the reactive phenolic compound are dissolved in an appropriate non-reactive or non-interfering solvent and an acid catalyst is added. No aldehyde compounds are present during the formation of the alternating copolymers. When a volatile reactive phenolic compound is used in excess, it may also serve as a solvent or co-solvent.

The condensation reaction leading to polymer formation can be carried out below, at or above ambient temperature. It is generally more practical to conduct the reaction at elevated temperature. A suitable acid catalyst may be a mineral acid such as hydrochloric acid, sulfuric acid, phosphoric acid, or an organic acid such as oxalic acid, maleic acid, formic acid, toluenesulfonic acid and the like. In certain cases, an inorganic catalyst may also be used. These may include compounds of zinc, manganese, magnesium, aluminum, titanium, copper, nickel and cobalt. Upon completion of the condensation reaction, the solvent and unreacted reactive phenolic compound may be removed via volatilization under reduced pressure and elevated temperature. The preferred method by which the polymer may be recovered from the reaction mixture is by precipitation of the polymer into liquid which is a non-solvent for the polymer but a solvent for the reaction solvent, catalyst and unreacted reactants. If this precipitation approach is used, the polymer is dried under reduced pressure. The resulting polymer is substantially an alternating copolymer structure.

Examples of regular alternating copolymers are shown below, where $n = 1$ to 25:

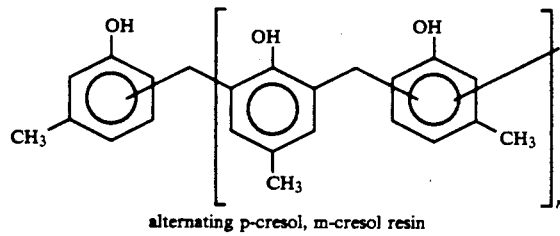

alternating p-cresol, m-cresol resin

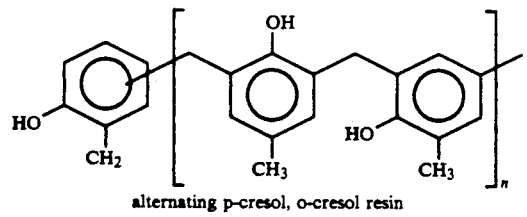

alternating p-cresol, o-cresol resin

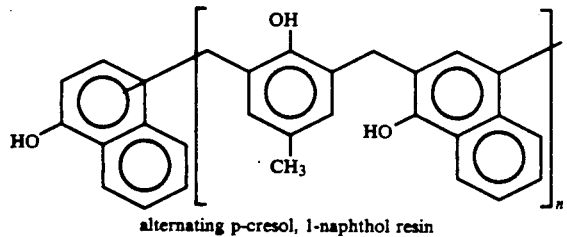

alternating p-cresol, 1-naphthol resin

The substantially alternating copolymer, produced by the above described acid catalyzed condensation reaction of a bishydroxymethylated phenol and a reactive phenol, can be further reacted with a second reactive phenol or mixture of phenols. When the reaction is carried out in the presence of an acid and an aldehyde, the resulting resin is substantially a block copolymer.

The block copolymers are characterized by a controlled amount of at least one of the reactive phenols present in the polymer. For example, when reacting m-cresol with 2,6-bis(hydroxymethyl)-4-methylphenol (dimethylol p-cresol), the only source of p-cresol in the polymer will be the dimethylol p-cresol. Assuming complete consumption of the dimethylol p-cresol, the polymer will be characterized by a known amount of p-cresol present in the alternating copolymer.

The choice of second reactive phenol compounds for formation of the block copolymer may be from the same groups as used in the formation of the alternating copolymer. These compounds include phenol, cresols, dimethylphenols, trimethylphenols, naphthols, biphenols, phenylphenols, bis(hydroxyphenyl)methane, isopropylidenebiphenol, catechols, resorcinols, thiobiphenols or mixtures thereof, which contain at least two sites in the aromatic ring(s) of sufficient reactivity.

The choice of aldehydes for the reaction include any aldehyde containing the RCHO functionality, including alkyl aldehydes and aromatic aldehydes. Preferred aldehydes include formaldehyde, benzaldehyde, salicylaldehyde or mixtures thereof.

Examples of block copolymers formed by this procedure include:

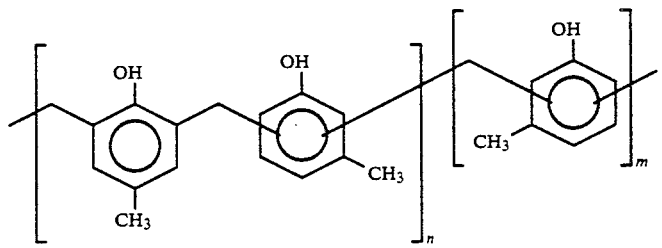

alternating p-cresol, m-cresol/m-cresol-formaldehyde block

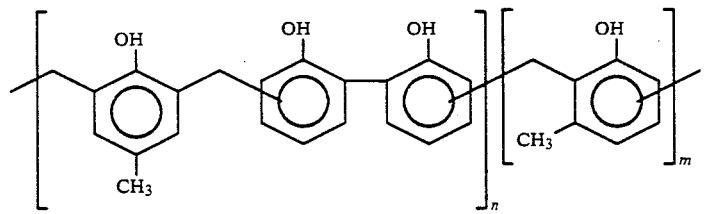

alternating p-cresol, 2,2'-bisphenol/m-cresol-formaldehyde block

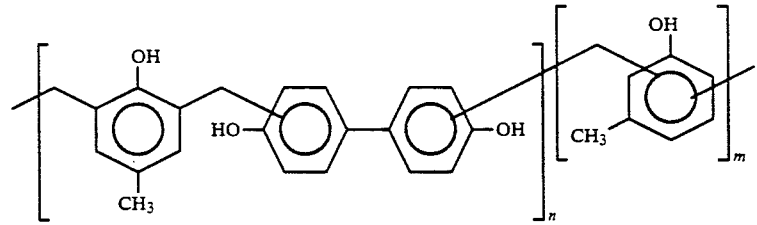

alternating p-cresol, 4,4'-biphenyl/m-cresol-formaldehyde block

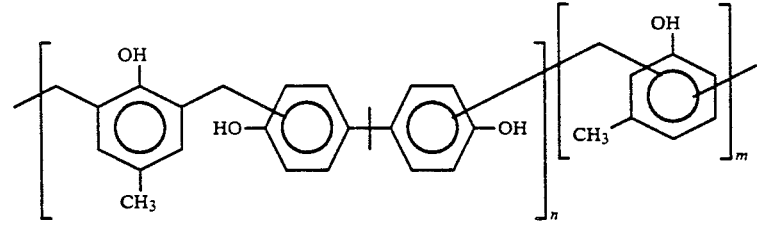

alternating p-cresol, bisphenol A/m-cresol-formaldehyde block

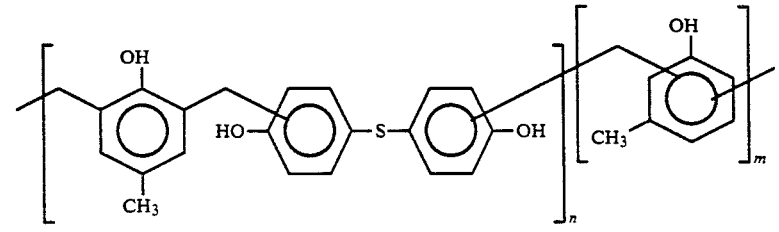

alternating p-cresol, 4,4'-thiophenol/m-cresol-formaldehyde block

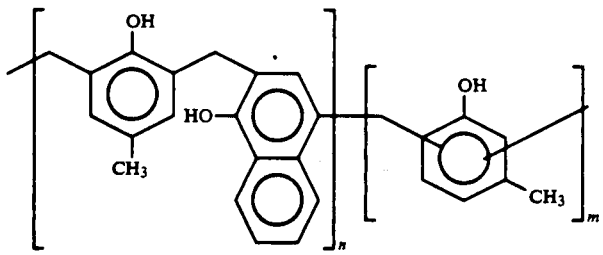

alternating p-cresol, 1-naphthol/m-cresol-formaldehyde block where n=1 to 25, and m=1 to 25.

Other diphenyl structures suitable for forming a block copolymer would have the structure represented by the general formula;

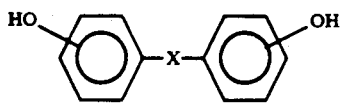

where $X = -CH_2$, $CR_1R_2$, oxygen, alkylene, arylene, and S.

Additionally, block copolymers may be formed using aromatic aldehydes. These block copolymers are characterized by elevated glass transition temperatures. The following example shows a block copolymer where the aldehyde used is an aromatic aldehyde. Again, n=1 to 25, and m=1 to 25:

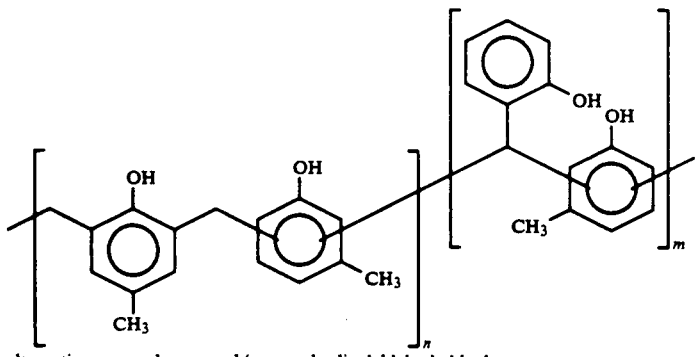

alternating p-cresol, m-cresol/m-cresol-salicylaldehyde block

All of the above alternating and block copolymers resins are characterized by enhanced ortho-, ortho- coupling and controlled narrow molecular weight distribution. It has been unexpectedly found that, in practicing the present invention as described above, coupling takes place selectively at the C-2 and C-4 positions. Normally, in random copolymers, coupling is found to be at the ortho-, para-, (C-2, C-4 or C-4, C-6) positions.

The following specific examples describe methods of preparing the novel resins of the present invention and are not to be taken as limitations to the same.

EXAMPLE 1

A Resin Formed from m-Cresol and 2,6-Bis(hydroxymethyl)-p-cresol

A 2-L four-neck resin kettle equipped with a stirrer, heating source, thermometer, variable reflux ratio distilling head and a nitrogen inlet tube was charged with 129.8 g m-cresol, 134.5 g 2,6-bis(hydroxymethyl)-p-cresol, 20 ml deionized water, 5.0 g oxalic acid dihydrate and 50 ml ethyl cellosolve acetate. The mixture was heated to about 60° C. at which point an exothermic condensation reaction ensued. The reaction was allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 217 g of an alternating resin having a number-average molecular weight, Mn, of 1640 Daltons and a Tg of 106° C. were obtained.

EXAMPLE 2

A Resin Formed from m-Cresol and 2,6-Bis(hydroxymethyl)-p-cresol and Formaldehyde A phenolic resin rich in alternating phenolic copolymer block segments was formed by first reacting a mixture of 519.0 g of 99 percent pure m-cresol, 538.2 g 97 percent pure 2,6-bis(hydroxymethyl)-p-cresol and 20 g oxalic acid dihydrate in a solvent mixture of 40 ml deionized water and 200 ml ethyl cellosolve acetate. The reaction mixture was heated to about 70° C. to initiate the reaction forming the alternating copolymer. At 102° C., 32.6 g of 36.9 percent formaldehyde was added in 8 minutes to the reaction mixture to form substantially m-cresol-formaldehyde block segments and to chemically bond these segments to the previously formed alternating copolymer. After heating the mixture at reflux for three hours, the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of a block copolymer resin having a number average molecular weight, $M_n$, of 1241 Daltons and a Tg of 112° C. were obtained.

EXAMPLE 3

A Resin Formed from m-Cresol, 2,6-Bis(hydroxymethyl)-p-cresol and 1-Naphthol

A mixture comprising of 72.1 g 1-naphthol, 84.1 g 2,6-bis(hydroxymethyl)-p-cresol, 5.0 g oxalic acid dihydrate and 150 ml ethyl cellosolve acetate in a 0.5-L resin kettle, equipped as in Example 1, was heated to initiate the condensation reaction substantially forming the 1-naphthol-methylene-p-cresol alternating copolymer. An exothermic reaction resulted, reaching a peak temperature of about 120° C. The reaction mixture was allowed to reflux for about 2 hours, at which time, 108.1 g m-cresol and 48.8 g of 36.9 percent formaldehyde were added, and the condensation mixture again allowed to reflux for about 2 hours. The volatiles present in the reaction mixture were removed by distillation and stripping as described in Example 2. About 201 g of a block copolymer resin, having a number average molecular weight, $M_n$, of 1940 Daltons and a Tg of about 121° C. were obtained.

EXAMPLES 4-6

Block Copolymer Resins

Table I defines the substantially block copolymers and their properties. Example 3 is repeated with the first reaction taking place between m-cresol and 2,6-bis(hydroxymethyl)-p-cresol. The second part of the reaction is carried out using formaldehyde and various other reactive phenols.

TABLE I

| Example | Mole Percent Reactants | $M_n$ | Tg, °C. |
|---|---|---|---|
| 4 | 50 A, 25 B, 25 C | 1780 | 127 |
| 5 | 70 A, 15 B, 15 D | 1680 | 99 |
| 6 | 70 A, 15 B, 15 E | 1210 | 86 |

A is m-cresol
B is 2,6-bishydroxymethyl)-p-cresol
C is 4,4'-biphenol
D is 4,4'-isopropylenediphenol
E is 4,4'-thiodiphenol

EXAMPLE 7

A Resin Formed from 1-Naphthol and 2,6-Bis(hydroxymethyl)-p-cresol

A 500-ml 3-neck round bottom flask equipped with a stirrer, reflux condenser, thermometer, a gas inlet tube and an acid trap was charged with 21.6 g 1-naphthol, 25.2 g 2,6-bis(hydroxymethyl)-p-cresol and 200 ml 1,4-dioxane. The mixture was heated to about 60° C. to dissolve the bishydroxymethyl-p-cresol. The warm solution was saturated with anhydrous hydrochloric acid and allowed to stand at ambient temperature for about 22 hours. The reaction mixture was then heated to about 70° C. to expel most of the dissolved hydrochloric acid. After it was allowed to cool, the solution was slowly added to about 3 L deionized water to precipitate the product. The precipitate was collected, partially dried and re-precipitated from acetone into water. The resin was dried under about 125 mm Hg vacuum at 60° to 70° C..About 40.4 g of an alternating copolymer resin having a number average molecular weight, $M_n$, of about 1530 Daltons and a Tg of 200° C. was obtained.

EXAMPLE 8

A Resin Formed from m-Cresol, Salicylaldehyde and 2,6-Bis(hydroxymethyl)-p-cresol Resin A mixture of 146.0 g m-cresol, 25.2 g 2,6-bis(hydroxymethyl)-p-cresol, 5.0 g 3-mercaptopropionic acid and 1.5 g p-toluenesulfonic acid monohydrate in 200 ml glacial acetic acid were charged into a 1-L reaction vessel equipped with a paddle stirrer, reflux condenser and a nitrogen inlet tube. The mixture was heated to reflux and maintained at reflux to allow formation of the alternating copolymer. After 8 hours, 146.5 g salicyaldehyde were added over time to the reaction mixture to form substantially m-cresol-salicylaldehyde block segments. Reflux was continued for 8 hours. The reaction mixture was slowly poured into 7-L deionized water to precipitate the resin. Once the solvent had exchanged with water, the product was collected on a filter, slurried once in warm deionized water for about 30 minutes, again collected, rinsed with water and dried in a vacuum oven under about 125 mm Hg and at about 100° to 105° C. About 281 g of a block copolymer resin having a number average molecular weight, $M_n$, of 1472 Daltons and a Tg of 233° C. were obtained.

What is claimed is:

1. A method of preparing an alkali soluble block copolymer, said method comprising the steps of:
    condensing a bishydroxymethyl phenol with a reactive phenol, in the absence of an aldehyde, to form an alternating copolymer; and
    reacting said alternating copolymer with a second reactive phenol, in the presence of an aromatic aldehyde, to form said block copolymer.

2. The method of claim 1 wherein said bishydroxymethyl phenol corresponds to the following formula:

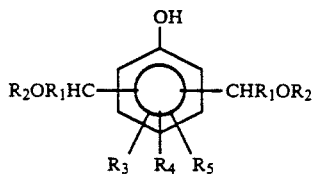

where;
    $R_1$ is hydrogen, an alkyl, an aryl, or a heterocyclic group;
    $R_2$ is hydrogen, an alkyl, or an acyl;
    $R_3$ and $R_5$ are hydrogen, halogen, an alkyl group free of a tertiary alpha-carbon atom, an alkoxy group having 1 to 4 carbons, a phenoxy group, an aryl group or an arylalkyl group; and
    $R_4$ is the same as $R_3$ and $R_5$, or a carboxylic group.

3. The method of claim 1 wherein said bishydroxymethyl phenol is the reaction product of formaldehyde with a phenol selected from the group consisting of o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid and p-nitro phenol.

4. The method of claim 1 wherein said reactive phenol selected from the group consisting of phenol, cresols, dimethylphenols, trimethylphenols, naphthols, biphenols, phenylphenols, bis(hydroxyphenyl)methane, isopropylidenebiphenols, catechols, resorcinols and thiobiphenols.

5. The method of claim 4 wherein said reactive phenol is selected from the group consisting of o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid and p-nitro phenol.

6. The method of claim 1 wherein said reactive phenol is bishydroxymethyl phenol.

7. The method of claim 1 wherein said aromatic aldehyde is selected from the group consisting of benzaldehyde, salicylaldehyde and mixtures thereof.

8. The method of claim 1 wherein said second reactive phenol is selected from the group consisting of phenol, cresols, dimethylphenols, trimethylphenols, naphthols, biphenols, phenylphenols, bis(hydroxyphenyl)methane, isopropylidenebiphenols, catechols, resorcinols, thiobiphenols or mixtures thereof.

9. The method of claim 7 wherein said second reactive phenol is selected from the group consisting of o-cresol, m-cresol, p-cresol, phenol, 2-phenyl phenol, 3-phenyl phenol, 4-phenyl phenol, 2,3-dimethylphenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid, p-nitro phenol or mixtures thereof.

10. An alkali soluble block copolymeric novolak resin having the formula:

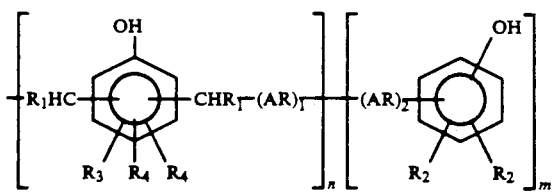

where:

$R_1$ is a member selected from the group consisting of hydrogen, an alkyl, an aryl, and a heterocyclic group;

$R_2$ is a member selected from the group consisting of hydrogen, an alkyl, an acyl group and a fused aromatic;

$R_3$ and $R_5$ are selected from the group consisting of hydrogen, halogen, an alkyl group free of a tertiary alpha-carbon atom, an alkoxy group having 1 to 4 carbon atoms, a phenoxy group, an aryl group and an arylalkyl group;

$R_4$ is the same as $R_3$ and $R_5$, and in addition is a carboxylic group;

$(AR)_1$ is derived from a member selected from the group consisting of phenol, cresol, dimethyl phenol, trimethyl phenol, naphthol, biphenol, phenylphenol, bis(hydroxyphenyl)methane isopropylidenediphenol, catechol, resorcinol or thiobiphenol;

$(AR)_2$ is derived from an aromatic aldehyde;

and where:

$n = 1$ to 25; and $m = 1$ to 25.

11. The block copolyer resin of claim 10 wherein said resin is characterized by a weight average molecular weight to number average molecular weight ratio in the range of 3 to 4 or lower.

* * * * *